United States Patent [19]

Tzeng

[11] Patent Number: 4,778,775
[45] Date of Patent: Oct. 18, 1988

[54] BURIED INTERCONNECT FOR SILICON ON INSULATOR STRUCTURE

[75] Inventor: J. C. Tzeng, Sunnyvale, Calif.

[73] Assignee: Intel Corporation, Santa Clara, Calif.

[21] Appl. No.: 54,806

[22] Filed: May 27, 1987

Related U.S. Application Data

[63] Continuation of Ser. No. 769,019, Aug. 26, 1985, abandoned.

[51] Int. Cl.[4] .................... H01L 21/263; H01L 21/225
[52] U.S. Cl. ................. 437/57; 148/DIG. 48; 148/DIG. 71; 148/DIG. 91; 148/DIG. 154; 156/603; 357/42; 357/88; 357/23.7; 437/69; 437/82; 437/99; 437/26; 437/174; 437/907; 437/963; 437/973
[58] Field of Search ............... 148/1.5, 174, 187, 175, 148/DIG. 53, 48, 82, 91, 122, 154; 357/59, 60, 42, 43, 23.1, 23.9, 23.5, 23.7; 29/576 E, 571; 156/612, 613; 437/26, 41, 57, 69, 82, 247, 973

[56] References Cited

U.S. PATENT DOCUMENTS

| | | | |
|---|---|---|---|
| 3,964,092 | 6/1976 | Wadham | 357/23.9 |
| 4,057,824 | 11/1977 | Woods | 357/59 |
| 4,269,631 | 5/1981 | Anantha et al. | 148/1.5 |
| 4,274,891 | 6/1981 | Silvestri et al. | 148/175 |
| 4,323,417 | 4/1982 | Lam | 156/613 |
| 4,381,202 | 4/1983 | Mori et al. | 148/1.5 |
| 4,481,706 | 11/1984 | Roche | 29/576 E |
| 4,489,479 | 12/1984 | Shields et al. | 357/59 |
| 4,542,580 | 9/1985 | Delivorias | 29/571 |
| 4,578,142 | 3/1986 | Corboy, Jr. et al. | 156/612 |
| 4,599,638 | 7/1986 | Flohrs | 357/43 |

FOREIGN PATENT DOCUMENTS 0021400  1/1981  European Pat. Off. .............. 357/59

Primary Examiner—Brian E. Hearn
Assistant Examiner—William Bunch
Attorney, Agent, or Firm—Blakely, Sokoloff, Taylor & Zafman

[57] ABSTRACT

Improved processing for forming an interconnect in a process where a recrystallized polysilicon layer is formed over an insulative layer and where recrystallization takes place through a plurality of seed windows formed in the insulative layer. A doped region is formed in the substrate prior to deposition of the polysilicon layer. The polysilicon layer is in contact with at least a portion of the doped region through an opening in the insulative layer. Recrystallization takes place through this opening, and, for instance, the doped region is electrically connected to a source or drain region of a semiconductor device formed in the recrystallized layer.

12 Claims, 3 Drawing Sheets

BURIED INTERCONNECT FOR SILICON ON INSULATOR STRUCTURE

This is a continuation of application Ser. No. 769,019 filed Aug. 26, 1985, now abandoned.

BACKGROUND OF THE INVENTION

1. Field of the Invention

The invention relates to the field of MOS integrated circuits, particularly those employing silicon on insulators.

2. Prior Art

The present application describes an improvement in a process where an epitaxial-like layer is formed over an insulative layer. The improvement of the present application results in the formation of an interconnect in the substrate.

A process for forming an epitaxial-like layer over an insulator is described in copending application, Ser. No. 700,607, filed Feb. 11, 1985, entitled PROCESS FOR FORMING ISOLATED SILICON REGIONS AND FIELD-EFFECT DEVICES ON A SILICON SUBSTRATE, assigned to the assignee of the present invention. In the process described in this application, an insulative layer is formed on a silicon substrate and openings are formed through this layer. A polysilicon layer is then deposited over the insulative layer and contacts the substrate through the openings. Various process steps are described for recrystallizing the polysilicon layer by propagating the crystalline structure of the substrate through the openings into the polysilicon layer. Relatively high quality monocrystalline silicon is formed above the seed windows through which the recrystallization occurs. These regions are used for channel regions of MOS field-effect devices. The source and drain region for these devices are formed in the recrystallized polysilicon layer adjacent to the seed windows and over the insulation; thus the source and drain regions are isolated from the substrate.

Sections of this process are described in conjunction with the present invention since the interconnect formed with the present invention is, in its currently preferred embodiment, integrated into the process described in this application.

It is well-known to form interconnects in the substrate during the fabrication of MOS devices. These interconnects are sometimes referred to as crossunders and often the dopant from a polysilicon layer is driven into the substrate to form the crossunders. Interconnects or crossunders formed in the substrate are described in U.S. Pat. Nos. 4,013,489 and 3,964,092. In these processes, the substrate itself is part of the active circuit devices. With the silicon on insulation circuits, there is an attempt to separate the active circuit from the substrate. The present invention describes a process for forming the interconnect in the substrate where the active devices themselves are formed above the insulative layer in a recrystallized layer.

SUMMARY OF THE INVENTION

The present invention describes an improvement in a process which forms a semiconductor layer over an insulative layer where the insulative layer is formed over a silicon substrate. More particularly, the semiconductor layer such as polycrystalline silicon (polysilicon), is recrystallized by propagation of the crystalline structure of the silicon substrate through openings in the insulative layer. Devices such as MOS field-effect devices are formed in the semiconductor layer. The improvement of the present invention comprises the formation of an interconnect within the substrate itself which provides interconnections between devices in the overlying semiconductor layer. A doped region is formed in the substrate prior to depositing the semiconductor layer over the insulative layer. An opening is formed through the insulative layer over at least a portion of this doped region, allowing the doped region to contact the semiconductor layer. The semiconductor layer is recrystallized through this opening, thereby connecting the crossunder with, for example, a source or drain region in the recrystallized layer.

DETAILED DESCRIPTION OF THE PRESENT INVENTION

Improved processing is described for forming an interconnect in an integrated circuit structure where the integrated circuit is fabricated in a recrystallized semiconductor layer formed on an insulative layer. In the following description, numerous specific details are set forth, such as specific conductivity types, etc., in order to provide a thorough understanding of the present invention. It will be obvious, however, to one skilled in the art that the present invention may be practiced without these specific details. In other instances, well-known processing steps have not been set forth in detail in order not to unnecessarily obscure the present invention.

As mentioned, the present invention is an improvement on processing described in copending application, Ser. No. 700,607, filed Feb. 11, 1985, entitled Process for Forming Isolated Silicon Regions and Field-Effect Devices on a Silicon Substrate, assigned to the assignee of the present invention. The application discussed specific details on certain steps in the present invention. Reference to this prior application in the present application is made as "prior application". As described later, the present invention can also be used without the recrystallization of the prior application.

The invented process is currently preferred for the fabrication of complementary metal-oxide-semiconductor (CMOS) integrated circuits. Thus, in the following description, reference is made to regions (such as wells) used to form a particular conductivity type field-effect device. Again, it will be obvious to one skilled in the art that the present invention may be used with other technologies.

Figure 1:
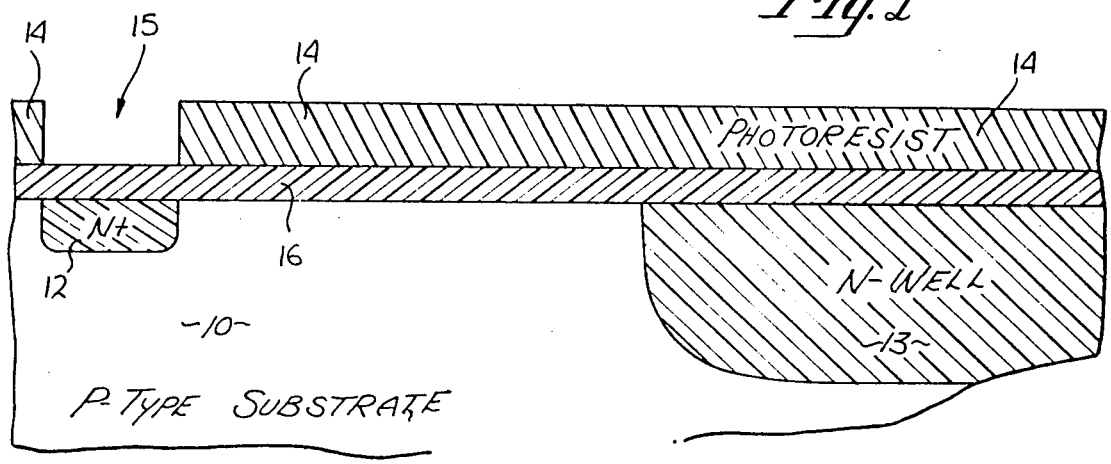
FIG. 1 is a cross-sectional elevation view of a portion of a substrate which shows an n-well and a doped region formed in the substrate.

Referring now to FIG. 1, a p-type monocrystalline silicon substrate 10 is shown which includes an n-well 13. As will be seen, the n-well is used, in part, for the fabrication of the p-channel devices of an integrated circuit. The substrate 10 includes a silicon dioxide layer 16 which covers the entire surface of the substrate. A photoresist layer 14 is formed on the surface and an opening 15 is shown through this layer. The opening 15 is defined at those regions where an interconnect formed in accordance with the present invention is desired. A doped region is formed in the substrate in alignment with the opening 15 as shown by region 12. It is this regions which becomes the interconnect or crossunder for the integrated circuit. Thus, this region may be an elongated region or a geometrically complex region. An ordinary ion implantation step may be used to form the region 12 where the ions are implanted through the silicon dioxide layer 16. Alternatively, the silicon dioxide layer 16 may be etched in alignment with opening 15 and an ordinary diffusion step used to form the doped region 12. The photoresist layer 14 is now removed.

Figure 2:
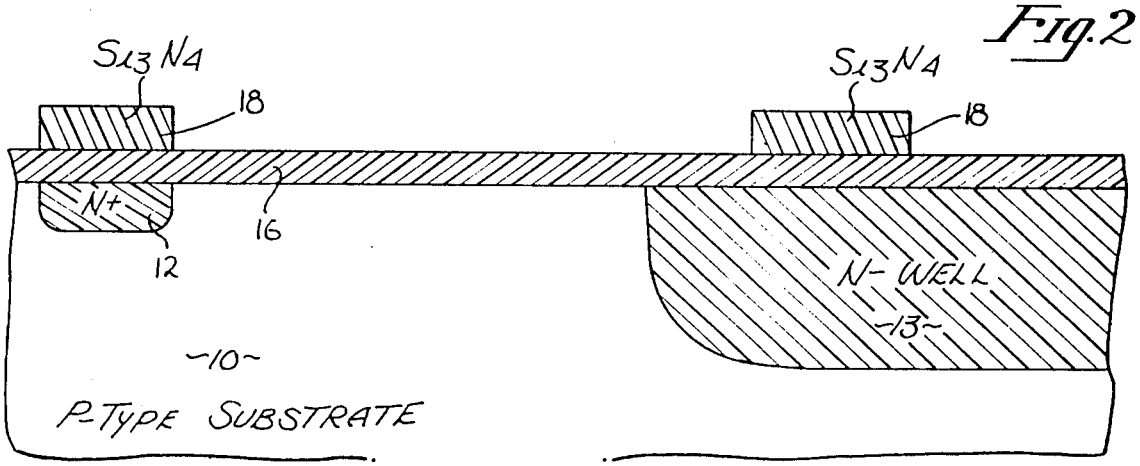
FIG. 2 illustrates the substrate of FIG. 1 after silicon nitride members have been formed on the substrate.

Next a silicon nitride layer is formed over the substrate and patterned using ordinary masking steps to form the masking members 18 shown in FIG. 2. One of these members is formed over the doped region 12. The silicon nitride member 18 formed over region 12 may be formed over the entire doped region 12 or over only portions of the region 12. (It is possible to have the region 12 crossunder subsequently grow field oxide regions.) In general, the members 18 are formed over the region 12 at those sites where it is proposed for the interconnect to connect with the subsequently formed overlying integrated circuit. The other masking member 18 shown in FIG. 2 are at sites of proposed channels of field-effect transistors in accordance with the teachings of the prior application.

Figure 3:
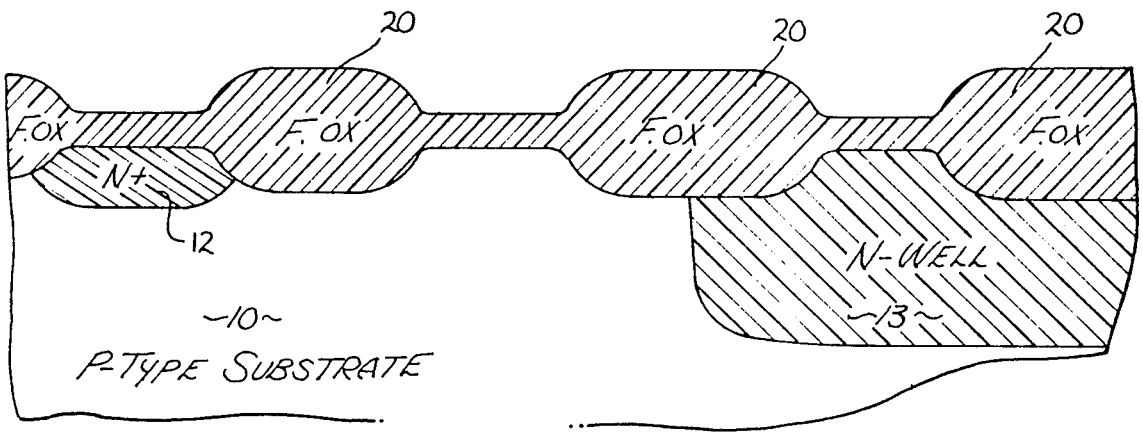
FIG. 3 illustrates the substrate of FIG. 2 after the growth of field oxide regions.

Relatively thick field oxide regions (silicon dioxide) are now grown with the silicon nitride masking members in place. As shown in FIG. 3, the field oxide regions 20 grow on the surface of the substrate where protection is not provided by the silicon nitride members. Note that the region 12 has a field oxide region disposed on both sides of region 12.

Figure 4:
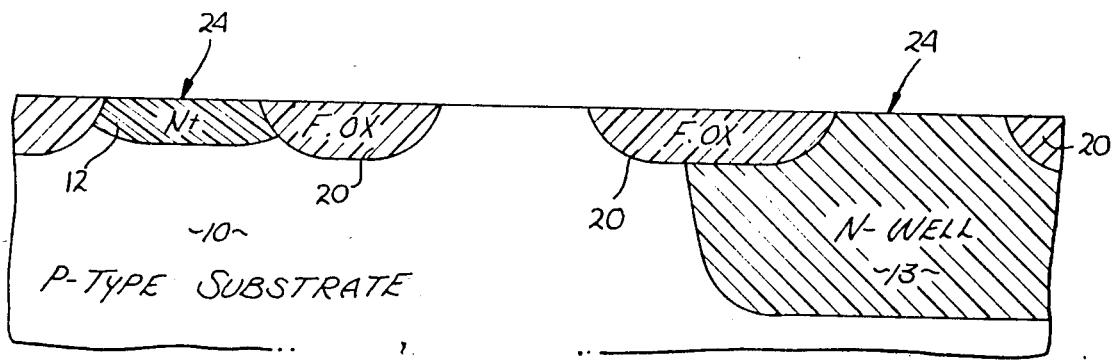
FIG. 4 illustrates the substrate of FIG. 3 after a planarization step.

In the presently preferred processing, a planarization step is now used following the removal of the silicon nitride members to planarize the surface of the substrate as shown in FIG. 4. The planarization is described in more detail in the prior application. This planarization and/or separate etching steps are used to form openings 24 which expose the substrate. Generally, these openings are formed at the sites of the previously removed silicon nitride members 18. These openings 24 of FIG. 4 thus are typically aligned with the silicon nitride members 18 of FIG. 2. This planarization step is not necessary to the present invention. Importantly, there is an opening above the doped region 12.

Figure 5:
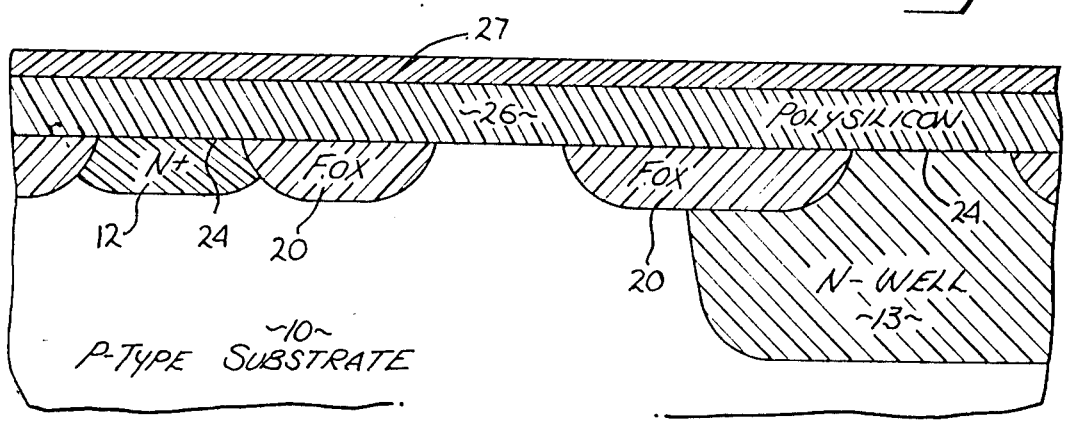
FIG. 5 illustrates the substrate of FIG. 4 after a polysilicon layer has been formed over the substrate.

A polysilicon layer 26 is now deposited over the substrate; it contacts the doped region 12 at opening 24 as illustrated in FIG. 5. A protective silicon dioxide layer 27 is also formed on the expoded surface of layer 26.

Figure 6:
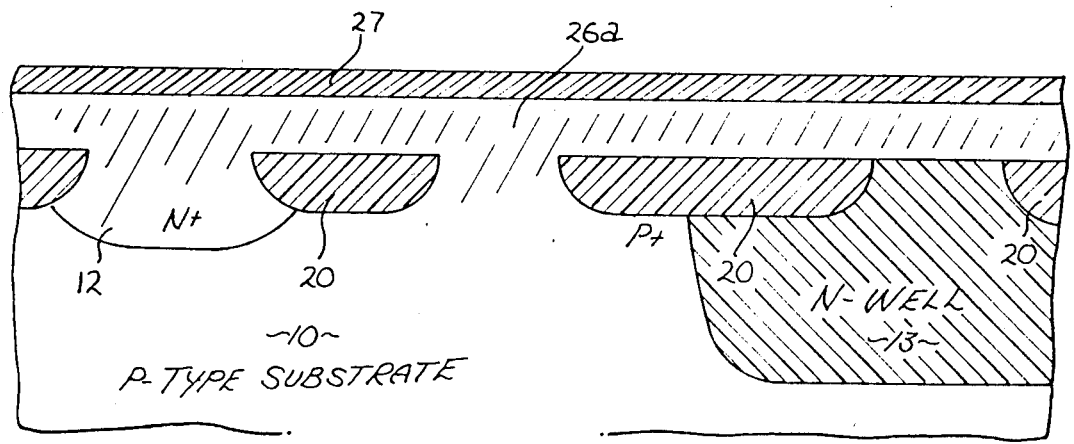
FIG. 6 illustrates the substrate of FIG. 5 after recrystallization of the polysilicon layer.

Now the layer 26 is recrystallized, causing this layer to take on the crystalline structure of the substrate. This can be accomplished by subjecting the substrate to heat from such sources as a scanning laser (e.g., CW argon laser), scanning electron beam or graphite strip heater. The openings 24 act as seed windows allowing the crystalline structure of the substrate to propagate or grow into layer 26. The layer 26 thus becomes an epitaxial-like layer shown as layer 26a in FIG. 6. This recrystallization is also described in the prior application.

While in the preferred embodiment substantial recrystallization of the polysilicon layer is used, the interconnect of the present invention can be formed even where no recrystallization occurs, for instance, where transistors are formed in the polysilicon layer.

Figure 7:
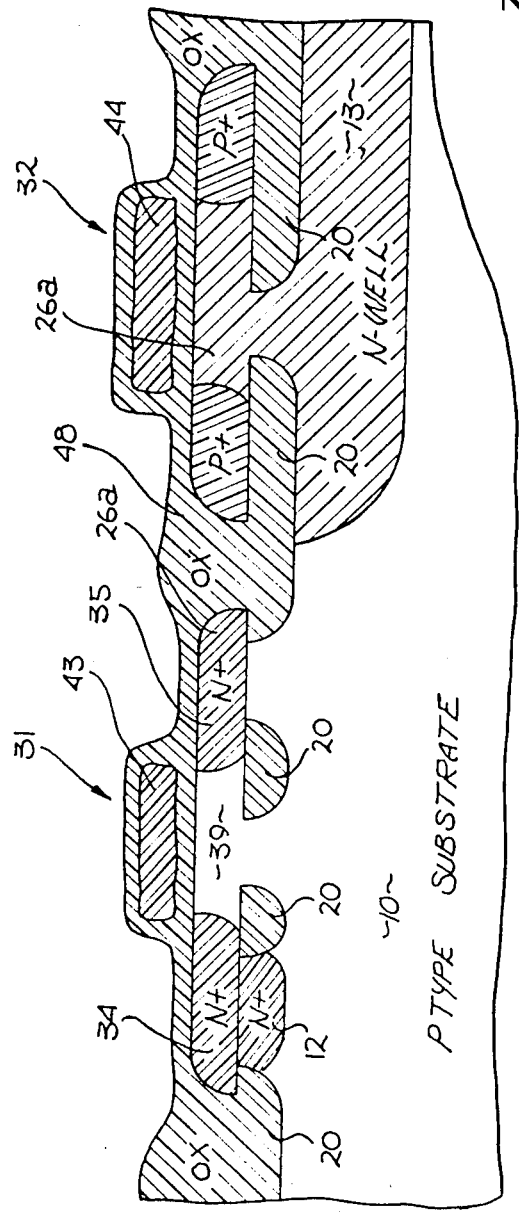
FIG. 7 is a cross-sectional elevation view showing a larger portion of the substrate of FIG. 6 after devices have been formed in the recrystallized polysilicon layer.

In FIG. 7, a wider view of the substrate is shown after field-effect devices have been formed in the recrystallized layer 26a. An n-type transistor 31 having a polycrystalline silicon gate 43 and source and drain regions 34 and 35 is shown formed above one of the seed windows. The channel 39 of this transistor is formed directly above the seed window, and as described in the prior application, the highest quality monocrystalline silicon occurs at these seed windows. The region 34 of this transistor is coupled directly to region 12. Thus, one terminal of this transistor may be interconnected with another device formed in the recrystallized layer 26a. Note that the insulative regions 20 cause a relatively long conductive path to be formed between the channel 39 of transistor 31 and well 13, thus reducing possible latch up. Another transistor 32 is also shown formed above the n-well 13. This p-type transistor includes a gate 44.

Transistors 31 and 32 are isolated from one another in the recrystallized layer by oxide region 48. The formation of this region is described in the prior application.

Figure 8:
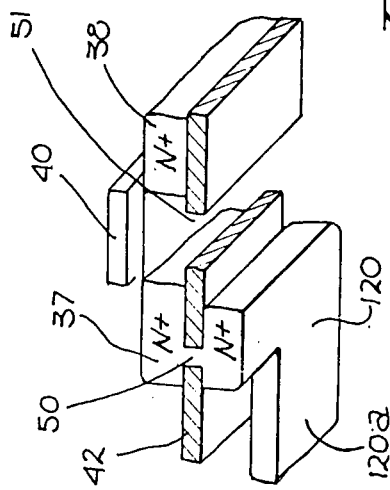
FIG. 8 is a perspective cut-away view of a crossunder fabricated in accordance with the present invention along with an overlying device formed in the recrystallized layer.

In FIG. 8, a transistor is shown formed in a recrystallized layer as described above. The source and drain regions 37 and 38 are formed on the insulative layer 42. The seed window 51 is open in this view. This region is typically the channel of the transistor as mentioned; a gate 40 overlies this channel. Another opening 50 through layer 42 includes the interconnect of the present invention. As can be seen in this view, the doped region 120 extends in two directions. That is, region 120a extends perpendicular to regions 37 and 38, and to the portion of region 120 underlying region 37. The doped region 120 may provide a common connection between several devices in the recrystallized layer.

Thus, an improvement in a process where integrated circuits are formed in a recrystallized polysilicon layer formed on an insulation is disclosed. In particular, an interconnect formed within the substrate forms the connection between devices in the recrystallized layer.

I claim:

1. In a metal-oxide-semiconductor (MOS) structure comprising a semiconductor substrate, an insulative layer formed over said semiconductor substrate, and a semiconductor layer formed over said insulative layer, a process for forming an interconnect in said semiconductor substrate between first and second devices formed in said semiconductor layer, said process comprising the steps of:

forming a doped region in said semiconductor substrate prior to forming said insulative layer on said substrate;

forming a second opening distinct from said first opening through said insulative layer over a second portion of said doped region;

forming said semiconductor layer over said insulative layer;

forming one of a source and drain terminal of said first device in said semiconductor layer over said first opening; and forming a terminal of said second device in said semiconductor layer over said second opening such that said doped region provides said interconnect in said substrate for interconnecting said terminals of each of said first and second devices.

2. The process of claim 1 further comprising the step of forming insulative regions in said semiconductor substrate adjacent to said doped region after forming said doped region and prior to forming said insulative layer.

3. The process of claim 1, wherein said semiconductor substrate comprises a silicon substrate and said insulative regions in said substrate adjacent to said doped region remain by:

forming a silicon nitride member over at least a portion of said doped region;

growing an oxide layer on said substrate with said silicon nitride member in place;

removing said silicon nitride member; and etching said oxide layer such that said doped region is exposed at the site of said removed silicon nitride member, and said insulative regions remain adjacent to said site of said removed silicon nitride member.

4. The process of claim 3 wherein said semiconductor layer comprises a polysilicon layer which is recrystallized.

5. The process of claim 1 wherein said insulative layer comprises a silicon dioxide layer.

6. The process of claim 1 wherein said terminal of said second device comprises one of a source and drain of said second device.

7. In a metal-oxide-semiconductor (MOS) structure comprising a semiconductor substrate, an insulative layer formed over said substrate, and a semiconductor layer formed over said insulative layer, a process for forming interconnects in said substrate below said insulative layer for interconnecting a plurality of devices formed in said semiconductor layer, said process comprising the steps of:

forming doped regions in said substrate prior to forming said insulative layer on said substrate, each of said doped regions for interconnecting terminals of a predetermined number of said devices;

forming said insulative layer over said substrate;

forming an opening through said insulative layer over each of said doped regions for each of said predetermined number of devices;

forming said semiconductor layer over said insulative layer;

forming one of said terminals of each of said predetermined number of devices at each one of said openings such that said doped regions disposed in said substrate provide interconnects in said substrate among said terminals, each of said terminals being one of source and drain of each of said devices.

8. The process of claim 7 further comprising the step of forming insulative regions in said substrate adjacent to said doped regions after forming said doped regions and prior to forming said insulative layer.

9. The process of claim 8 wherein said semiconductor substrate comprises a silicon substrate and said insulative regions in said substrate adjacent to said doped regions remain by:

forming silicon nitride members over predetermined portions of said doped regions;

growing an oxide layer on said substrate with said silicon nitride members in place;

removing said silicon nitride members; and etching said oxide layer such that said doped regions are exposed at the sites of said removed silicon nitride members and said insulative regions remain adjacent to said sites of said removed silicon nitride members.

10. The process of claim 9 wherein said semiconductor layer comprises a polysilicon layer recrystallized over said openings in said insulative layer.

11. The process of claim 10 wherein said insulative layer comprises a silicon dioxide layer.

12. The process of claim 11 wherein said semiconductor substrate comprises a silicon substrate.

* * * * *